(12) United States Patent
Lee et al.

(10) Patent No.: US 11,367,597 B2
(45) Date of Patent: Jun. 21, 2022

(54) ELECTROSTATIC CHUCK AND PLASMA PROCESSING APPARATUS INCLUDING THE SAME

(71) Applicant: SAMSUNG ELECTRONICS CO., LTD., Suwon-si (KR)

(72) Inventors: Yongwoo Lee, Hwaseong-si (KR); Youngjin Noh, Ansan-si (KR); Dowon Kim, Jecheon-si (KR); Donghyeon Na, Hwaseong-si (KR); Seungbo Shim, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 149 days.

(21) Appl. No.: 16/259,185

(22) Filed: Jan. 28, 2019

(65) Prior Publication Data
US 2020/0013595 A1 Jan. 9, 2020

(30) Foreign Application Priority Data

Jul. 5, 2018 (KR) .................. 10-2018-0078385
Oct. 2, 2018 (KR) .................. 10-2018-0117573

(51) Int. Cl.
*H01J 37/32* (2006.01)
*H01L 21/67* (2006.01)
*H01L 21/683* (2006.01)

(52) U.S. Cl.
CPC .... *H01J 37/32697* (2013.01); *H01J 37/3244* (2013.01); *H01J 37/32715* (2013.01); *H01L 21/67069* (2013.01); *H01L 21/6833* (2013.01)

(58) Field of Classification Search
None
See application file for complete search history.

(56) References Cited

U.S. PATENT DOCUMENTS

| 5,542,559 | A | * | 8/1996 | Kawakami | .......... H01L 21/6838 |
| | | | | | 216/67 |
| 8,724,289 | B2 | | 5/2014 | Shiraiwa et al. | |
| 9,083,182 | B2 | | 7/2015 | Sato | |
| 9,412,635 | B2 | | 8/2016 | Sasaki et al. | |
| 9,887,117 | B2 | | 2/2018 | Katayama et al. | |
| 2014/0008880 | A1 | * | 1/2014 | Miura | .......... H01L 21/6831 |
| | | | | | 279/128 |
| 2014/0202635 | A1 | | 7/2014 | Yamaguchi et al. | |
| 2014/0238609 | A1 | | 8/2014 | Tomioka et al. | |
| 2016/0276198 | A1 | * | 9/2016 | Anada | .......... H01L 21/6833 |
| 2018/0025933 | A1 | * | 1/2018 | Ishimura | .......... H01L 21/67103 |
| | | | | | 269/8 |

FOREIGN PATENT DOCUMENTS

JP   2011-159684 A   8/2011
JP   2012-235037 A   11/2012
(Continued)

*Primary Examiner* — Karla A Moore
*Assistant Examiner* — Tiffany Z Nuckols
(74) *Attorney, Agent, or Firm* — Lee IP Law, PC

(57) ABSTRACT

An electrostatic chuck includes a chuck base having a first hole, an upper plate provided on the chuck base, the upper plate having a second hole aligned with the first hole, and an adhesive layer attaching the upper plate to the chuck base, the adhesive layer having a thickness that is less than a diameter of the first hole and equal to a diameter of the second hole.

16 Claims, 6 Drawing Sheets

(56) References Cited

FOREIGN PATENT DOCUMENTS

| JP | 2016-143743 A | 8/2016 | |
| JP | 2016-143744 A | 8/2016 | |
| JP | 2017-162899 A | 9/2017 | |
| KR | 10-2008-0004115 A | 1/2008 | |
| WO | WO-2016132909 A1 * | 8/2016 | ....... H01L 21/67109 |

* cited by examiner

ELECTROSTATIC CHUCK AND PLASMA PROCESSING APPARATUS INCLUDING THE SAME

CROSS-REFERENCE TO RELATED APPLICATIONS

Korean Patent Application No. 10-2018-0078385 filed on Jul. 5, 2018, and No. 10-2018-0117573 filed on Oct. 2, 2018, in the Korean Intellectual Property Office, and entitled: "Electrostatic Chuck and Plasma Processing Apparatus Including the Same," is incorporated by reference herein in its entirety.

BACKGROUND

1. Field

Embodiments relate to an electrostatic chuck a plasma processing apparatus including the same.

2. Description of the Related Art

In general, semiconductor devices are fabricated using a plurality of unit processes, such as a thin film deposition process, a photolithography process, and an etching process. The etching process may include a dry etching process, in which a plasma reaction is used. A system for performing the dry etching process may include an electrostatic chuck, on which a substrate is loaded, configured to fasten the substrate thereon using an electrostatic force.

SUMMARY

Embodiments are directed to an electrostatic chuck, including a chuck base having a first hole, an upper plate provided on the chuck base, the upper plate having a second hole aligned with the first hole, and an adhesive layer attaching the upper plate to the chuck base, the adhesive layer having a thickness that is less than a diameter of the first hole and equal to a diameter of the second hole.

Embodiments are also directed to a plasma processing apparatus, including a chamber, an electrostatic chuck provided in the chamber and used to load a substrate, and a refrigerant supply part configured to supply a refrigerant gas into the electrostatic chuck. The electrostatic chuck may include a chuck base having a lower hole, an upper plate provided on the chuck base, the upper plate having an upper hole aligned with the lower hole, and an adhesive layer attaching the upper plate to the chuck base, the adhesive layer having a thickness that is less than a diameter of the first hole and equal to a diameter of the second hole.

Embodiments are also directed to a method of fabricating a semiconductor device, the method including providing a substrate on an electrostatic chuck, providing a DC power to the electrostatic chuck, and providing a high or radio frequency power to the electrostatic chuck to produce plasma on the electrostatic chuck. The electrostatic chuck may include a chuck base having a first hole, an upper plate provided on the chuck base, the upper plate having a second hole aligned with the first hole, and an adhesive layer attaching the upper plate to the chuck base, the adhesive layer having a thickness that is less than a diameter of the first hole and equal to a diameter of the second hole.

BRIEF DESCRIPTION OF THE DRAWINGS

Features will become apparent to those of skill in the art by describing in detail example embodiments with reference to the attached drawings in which.

DETAILED DESCRIPTION

Figure 1:
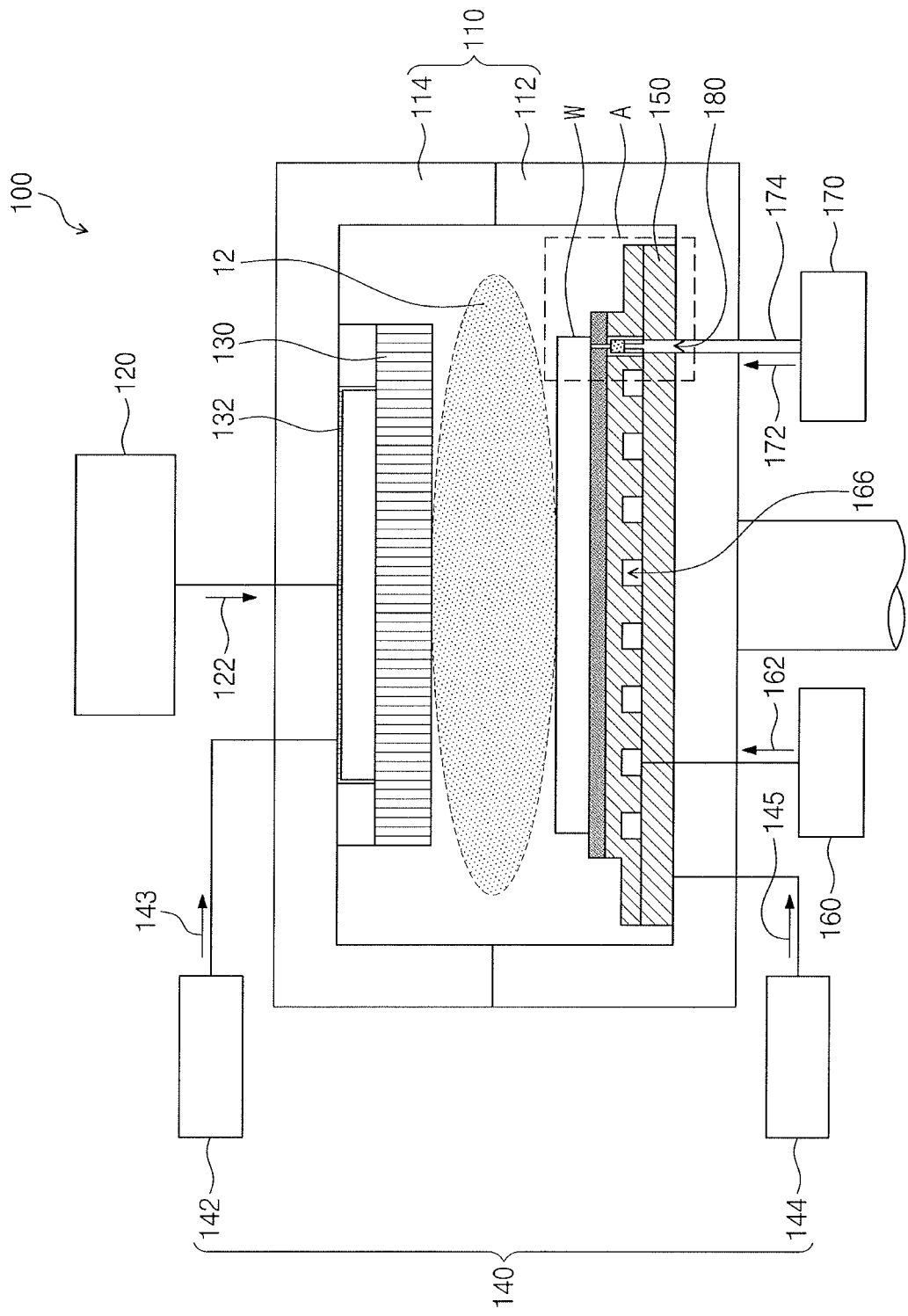
FIG. 1 is a diagram of an example of a plasma processing apparatus according to an example embodiment.

FIG. 1 is a diagram of an example of a plasma processing apparatus 100 according to an example embodiment.

Referring to FIG. 1, the plasma processing apparatus 100 may be a capacitively coupled plasma (CCP) etching system. In an example embodiment, the plasma processing apparatus 100 may be, for example, an inductively coupled plasma (ICP) etching system or a microwave plasma etching system. In an example embodiment, the plasma processing apparatus 100 may include a chamber 110, a reaction gas supplying part 120, a showerhead 130, an RF supply part 140, an electrostatic chuck 150, a DC power supply part 160, and a refrigerant supply part 170.

The chamber 110 may be configured to provide a space isolated from an outside. A substrate W may be provided in the chamber 110. The substrate W may include or be, for example, a silicon wafer. In an example embodiment, the chamber 110 may include a lower housing 112 and an upper housing 114. When the substrate W is transferred into the chamber 110, the lower housing 112 and the upper housing 114 may be separated from each other. When a fabrication process is performed on the substrate W, the lower housing 112 and the upper housing 114 may be combined to each other.

The reaction gas supplying part 120 may be configured to supply a reaction gas 122 into the chamber 110. In an example embodiment, the reaction gas 122 may be used to etch, for example, the substrate W or a silicon oxide layer on the substrate W. The reaction gas 122 may include, for example, $CH_3$ or $SF_6$. In an example embodiment, the reaction gas 122 may be used to deposit a thin film on the substrate W.

The showerhead 130 may be provided in the upper housing 114. The showerhead 130 may be connected to the reaction gas supplying part 120. The showerhead 130 may be configured to spray the reaction gas 122 onto the substrate W. The showerhead 130 may have an upper electrode 132. The upper electrode 132 may be connected to the RF supply part 140.

The RF supply part 140 may be configured to provide a radio or high frequency power from an outside of the chamber 110 to the upper electrode 132 and the electrostatic chuck 150. In an example embodiment, the RF supply part 140 may include a first RF supply part 142 and a second RF supply part 144. The first RF supply part 142 may be connected to the upper electrode 132. The first RF supply part 142 may be configured to provide a source power 143 to the upper electrode 132. The source power 143 may be used to produce or induce plasma 12 in the chamber 110. The second RF supply part 144 may be connected to the electrostatic chuck 150. The second RF supply part 144 may be used to provide a bias power 145 to the electrostatic chuck 150. The bias power 145 may be used to concentrate the plasma 12 on the substrate W. An etch rate of the substrate W or a layer on the substrate W may be determined in proportion to the bias power 145. In an implementation where the upper electrode 132 is not provided in the showerhead 130, the source power 143 may be provided to the electrostatic chuck 150. If an etch depth of the substrate W or the silicon oxide is greater than a specific depth, the source power 143 and the bias power 145 may be provided in the form of a pulse.

The electrostatic chuck 150 may be provided in the lower housing 112. The electrostatic chuck 150 may be configured to contain the substrate W. The substrate W may be loaded on the electrostatic chuck 150. If the plasma 12 is induced on the electrostatic chuck 150, the electrostatic chuck 150 may be cooled by a cooling water that is provided in a cooling water hole 166.

The DC power supply part 160 may be configured to supply a DC power 162 to the electrostatic chuck 150. If the plasma 12 is produced on the substrate W, the electrostatic chuck 150 may hold the substrate W thereon using the DC power 162 provided from a DC power supply part 160. The substrate W may be fastened to the electrostatic chuck 150 by a Coulomb force or Johnsen-Rahbek force of the DC power 162.

The refrigerant supply part 170 may be configured to supply a fluid, for example, a refrigerant gas 172, into the electrostatic chuck 150 through a supplying line 174. The refrigerant gas 172 may be provided to a bottom surface of the substrate W through the electrostatic chuck 150. In the case where the substrate W is heated by the plasma 12, the refrigerant gas 172 may be used to cool the substrate W. The refrigerant gas 172 may serve as a heat transfer material between the substrate W and the electrostatic chuck 150. For example, the refrigerant gas 172 may include a helium (He) gas.

A structure of the electrostatic chuck 150 supplying the refrigerant gas 172 to the bottom surface of the substrate W will be described in more detail below.

Figure 2:
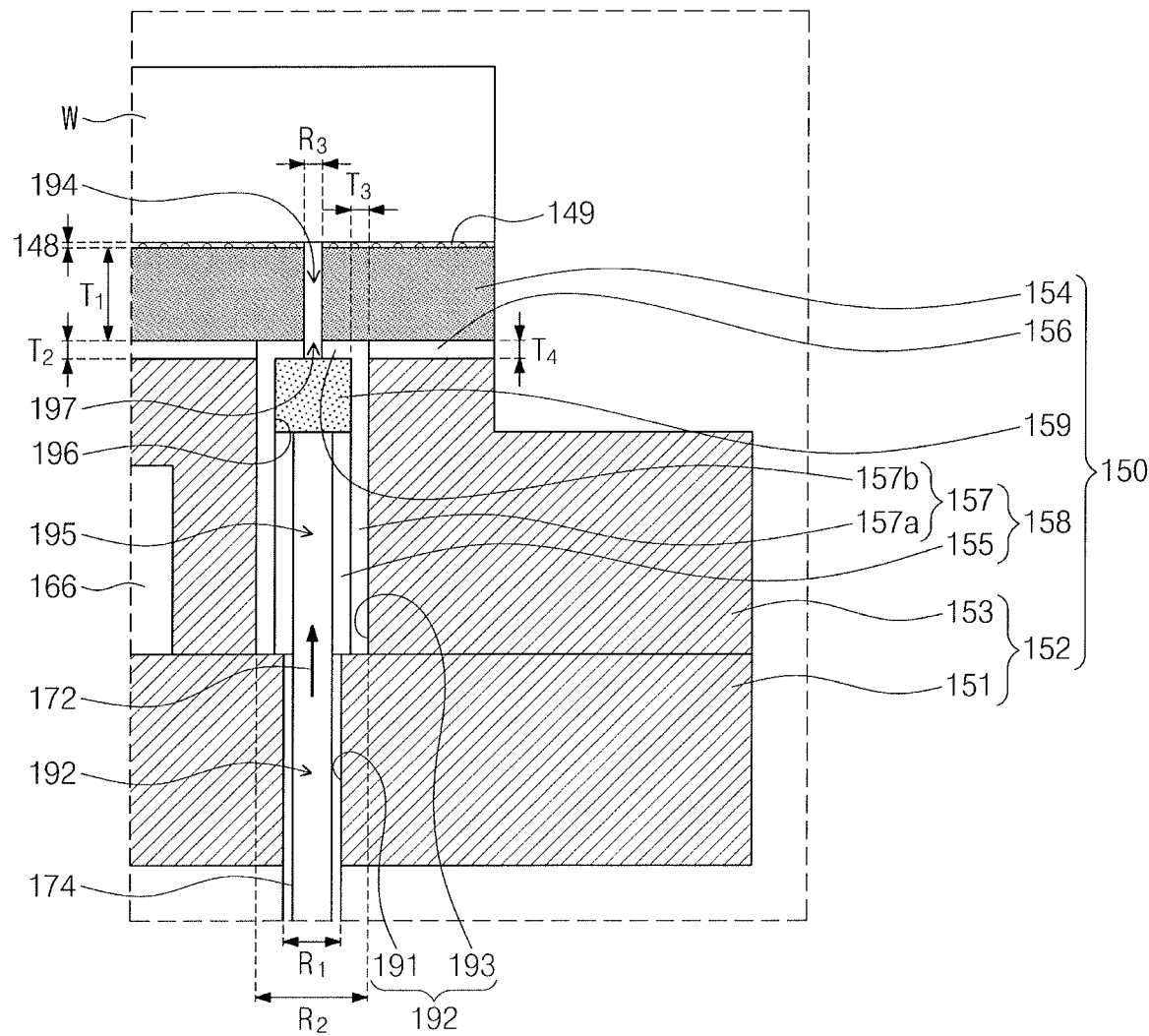
FIG. 2 is a sectional view of an example of a portion (for example 'A' of FIG. 1) of an electrostatic chuck.
Figure 3:
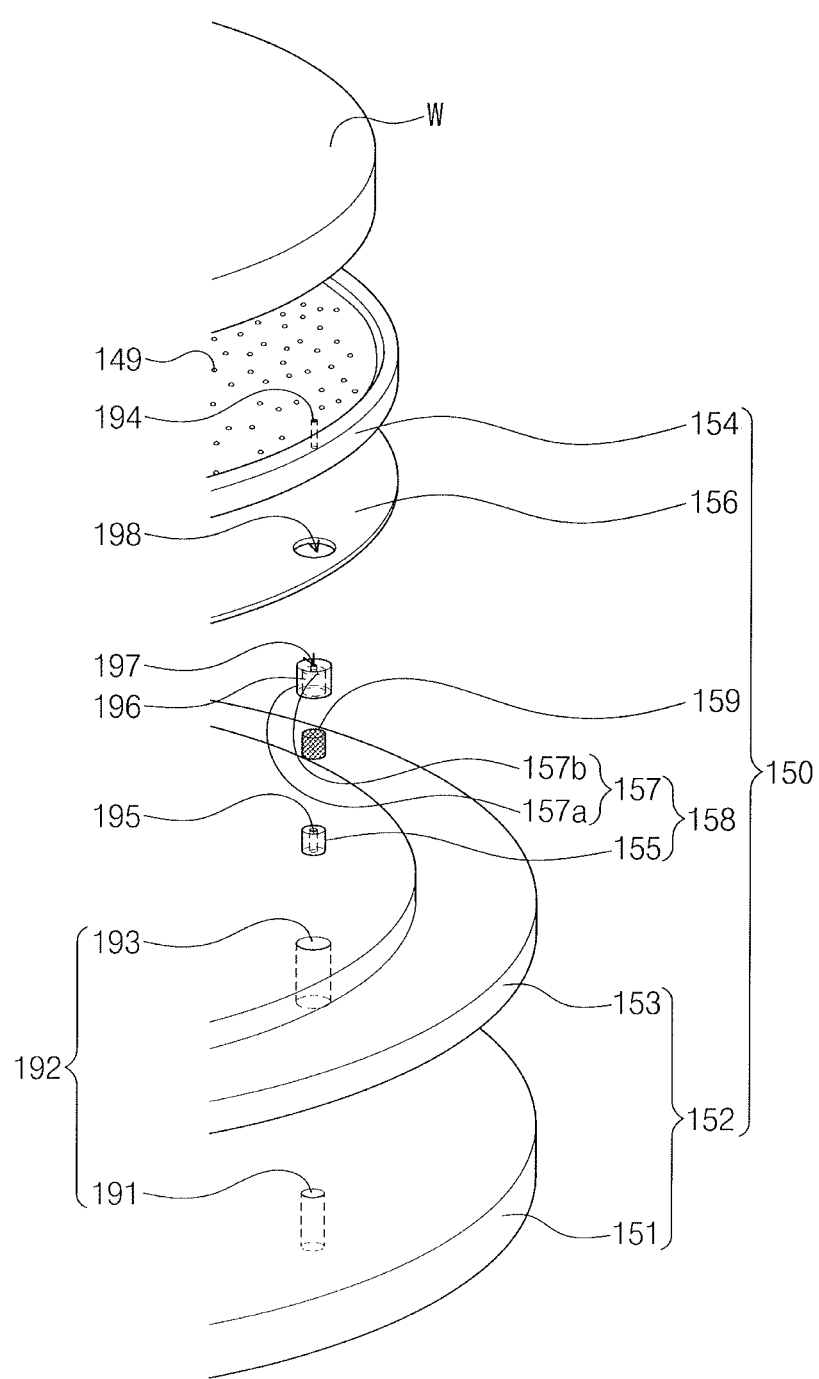
FIG. 3 is an exploded perspective view of the electrostatic chuck of FIG. 2.

FIG. 2 is a sectional view illustrating an example of a portion (for example 'A' of FIG. 1) of the electrostatic chuck 150, and FIG. 3 is an exploded perspective view of the electrostatic chuck 150 of FIG. 2.

Referring to FIGS. 2 and 3, the electrostatic chuck 150 may include a chuck base 152, an upper plate 154, an adhesive layer 156, bushings 158, and a porous block 159.

The chuck base 152 may be wider or larger than the substrate W, when viewed in a plan view. The chuck base 152 may be formed of or include, for example, at least one of aluminum or an aluminum alloy. In an example embodiment, the chuck base 152 may have a lower hole 192. The lower hole 192 may include a first lower hole 191 and a second lower hole 193. The first lower hole 191 may be provided below the second lower hole 193. The supplying line 174 may be inserted into the first lower hole 191. The refrigerant gas 172 may be provided to an upper hole 194 through the first lower hole 191 and the second lower hole 193. In an example embodiment, the chuck base 152 may include a first lower plate 151 and a second lower plate 153.

The first lower plate 151 may have the first lower hole 191. A connector connected to the supplying line 174 or the supplying line 174 may be provided in the first lower hole 191. A diameter $R_1$ of the first lower hole 191 may range from, for example, about 1 mm to about 5 mm.

The second lower plate 153 may be provided on the first lower plate 151. A diameter of the second lower plate 153 may be equal to or smaller than a diameter of the first lower plate 151. The second lower plate 153 may have the second lower hole 193. The second lower hole 193 may be aligned to the first lower hole 191. A diameter $R_2$ of the second lower hole 193 may be larger than the diameter $R_1$ of the first lower hole 191. The diameter $R_2$ of the second lower hole 193 may range from, for example, about 4.7 mm to about 14 mm. In an implementation, a plurality of second lower holes 193 may be provided, in which case the first lower hole 191 may include a plurality of branch holes connecting the plurality of second lower holes 193 in a horizontal direction. The cooling water holes 166 of FIG. 1 may be formed between the first lower plate 151 and the second lower plate 153.

The upper plate 154 may be provided on the second lower plate 153. The substrate W may be provided on the upper plate 154. The upper plate 154 may be formed of or include, for example, a ceramic or dielectric material (for example alumina ($Al_2O_3$)) and may have a thickness $T_1$ ranging from, for example, about 0.3 mm to about 1.7 mm. When the substrate W is provided on the upper plate 154, the substrate W may be electrically disconnected from the chuck base 152 by the upper plate 154. The upper plate 154 may have the upper hole 194. A diameter $R_3$ of the upper hole 194 may be smaller than the diameter $R_2$ of the second lower hole 193. In an example embodiment, the diameter $R_3$ of the upper hole 194 may be equal to a thickness $T_2$ of the adhesive layer 156. The diameter $R_3$ of the upper hole 194 may be, for example, from about 0.1 to about 0.3 mm. The refrigerant gas 172 may be provided to the bottom surface of the substrate W through the lower hole 192 and the upper hole 194.

The upper plate 154 may have dielectric protrusions 149. The dielectric protrusions 149 may be provided on a top surface of the upper plate 154 and may be in contact with the bottom surface of the substrate W. Owing to the presence of the dielectric protrusions 149, a gap 148 may be formed between the substrate W and the top surface of the upper plate 154 between the protrusions 149. When the refrigerant gas 172 is provided into the gap 148 through the upper hole 194, the substrate W may be cooled to a temperature lower than that of the plasma 12 and higher than a room temperature by the refrigerant gas 172. For example, the substrate W may have a temperature ranging from about 100° C. to about 200° C.

The adhesive layer 156 may be provided between the upper plate 154 and the second lower plate 153. The adhesive layer 156 may be used to fix the upper plate 154 on the first lower plate 151. The adhesive layer 156 may have a third lower hole 198 whose size is the same size as that of the second lower hole 193. In an example embodiment, the adhesive layer 156 may be formed of or include a silicone adhesive. The adhesive layer 156 may have the thickness $T_2$ ranging from about 0.1 mm to about 0.4 mm. The adhesive layer 156 may have thermal conductivity ranging from, for example, about 0.3 W/mK to about 0.4 W/mK. The thermal conductivity of the adhesive layer 156 may be selected in inverse proportion to a desired temperature of the substrate W. If the adhesive layer 156 has high thermal conductivity of 0.8 W/mK or higher, the temperature of the substrate W may be lowered. If the temperature of the substrate W is lowered, etching characteristics of the substrate W at a high temperature may be deteriorated. By contrast, if the thermal conductivity of the adhesive layer 156 is low, the temperature of the substrate W may be increased. If the temperature of the substrate W is increased, the etching characteristics of the substrate W at a high temperature may be improved. In an example embodiment, thermal resistance of the adhesive layer 156 may be defined as a value that is obtained dividing the thickness $T_2$ of the adhesive layer 156 by the thermal conductivity of the adhesive layer 156. The thermal resistance of the adhesive layer 156 may be selected in proportion to the temperature of the substrate W. If the thermal resistance of the adhesive layer 156 is increased, the etching characteristics of the substrate W at a high temperature may be improved.

The bushings 158 may be provided in the second lower hole 193 of the second lower plate 153. The bushings 158 may be formed of, for example, a ceramic material (for example alumina ($Al_2O_3$)). The bushings 158 may be provided along an inner side surface of the second lower hole 193 (for example from a top surface of the first lower plate 151 to a bottom surface of the upper plate 154). In an example embodiment, each of the bushings 158 may include a lower bushing 155 and an upper bushing 157.

The lower bushing 155 may be provided in a lower region of the second lower hole 193. The lower bushing 155 may be disposed on the first lower plate 151 adjacent to the first lower hole 191. The lower bushing 155 may have a first bushing hole 195 and may have a ring shape, when viewed in a plan view. The refrigerant gas 172 in the supplying line 174 may be provided into the first bushing hole 195. The first bushing hole 195 may be smaller than the first lower hole 191 and the second lower hole 193.

The upper bushing 157 may be provided in the second lower hole 193. The upper bushing 157 may have an outer diameter that is equal to or smaller than the diameter $R_2$ of the second lower hole 193. The upper bushing 157 may be provided between the lower bushing 155 and the upper plate 154. The upper bushing 157 may have a shape different from that of the lower bushing 155. In an example embodiment, the upper bushing 157 may include a ring portion 157a and a capping portion 157b. In an example embodiment, the ring portion 157a and the capping portion 157b may be connected to each other, thereby constituting a single object.

The ring portion 157a may be provided to enclose the lower bushing 155 and the porous block 159. The ring portion 157a may be provided in the second lower hole 193 and between an inner side surface of the second lower plate 153 and the porous block 159. The ring portion 157a may have an outer diameter that is equal to or smaller than the diameter $R_2$ of the lower hole 193. The ring portion 157a may have a thickness $T_3$ of, for example, about 0.6 mm. The lower bushing 155 may be provided in a second bushing hole 196 of the ring portion 157a.

The capping portion 157b may be provided to cover the porous block 159 in the ring portion 157a. The capping portion 157b may have a thickness $T_4$ that is substantially equal to the thickness $T_3$ of the ring portion 157a. For example, the thickness $T_4$ of the capping portion 157b may be about 0.6 mm. The capping portion 157b may have a diameter that is equal to or smaller than the diameter $R_2$ of the second lower hole 193. The diameter of the capping portion 157b may be, for example, $R_2$. In an example embodiment, the capping portion 157b may have a third bushing hole 197. The third bushing hole 197 may be aligned to the upper hole 194. The refrigerant gas 172 may be supplied to sequentially pass through the first bushing hole 195, the second bushing hole 196, the third bushing hole 197, and the upper hole 194. A diameter of the third bushing hole 197 may be substantially equal to the diameter $R_3$ of the upper hole 194. The diameter of the third bushing hole 197 may be, for example, about 0.3 mm.

A top surface of the capping portion 157b may be in contact with the bottom surface of the upper plate 154. If an area of the capping portion 157b is increased, an area of the capping portion 157b in contact with the bottom surface of the upper plate 154 may be increased. In an example embodiment, the top surface of the capping portion 157b may be attached to the bottom surface of the upper plate 154 by a ceramic adhesive material.

The porous block 159 may be provided in the ring portion 157a of the upper bushing 157. The refrigerant gas 172 in the ring portion 157a may pass through the porous block 159. The porous block 159 may buffer pressure of the refrigerant gas 172 in a refrigerant hole 180. The porous block 159 may include a dielectric material. The porous block 159 may include, for example, a ceramic material (for example, alumina) having a pore density of, for example, about 50% to about 60%.

Referring back to FIG. 1, when the plasma 12 is produced in the chamber 110, the substrate W may be heated to a high temperature of, for example, about 100° C. to 200° C. by the plasma 12. If the substrate W is heated to the high temperature, a heat energy of the substrate W may be transferred to the capping portion 157b and the adhesive layer 156 through the refrigerant gas 172 and the upper plate 154. If the heat energy of the substrate W is transferred to the capping portion 157b and the adhesive layer 156 through the refrigerant gas 172 and the upper plate 154, the heat energy may be transferred to the chuck base 152 through the capping portion 157b and the adhesive layer 156. The porous block 159 may have a density lower than that of the lower plate 153 such that the heat energy, which is transferred to the capping portion 157b from the substrate W, may be mainly transferred to the second lower plate 153.

The capping portion 157b may be used as a heat transfer passage between the upper plate 154 on the second lower hole 193 and the second lower plate 153. The capping portion 157b may have a thermal resistance between a thermal resistance of the upper plate 154 and a thermal resistance of the second lower plate 153. The thermal resistance of the capping portion 157b may be in proportion to the thickness $T_4$ and the diameter $R_2$ of the capping portion 157b. For example, the thermal resistance of the capping portion 157b may be calculated as a product of thermal conductivity, the thickness $T_4$, and the diameter $R_2$ of the capping portion 157b. In another implementation, the thermal resistance of the capping portion 157b may be increased in proportion to the thickness $T_4$ and a radius ($R_2/2$) of the capping portion 157b.

The adhesive layer 156 may also be used as a heat transfer passage between the upper plate 154 and the lower plate 153. A thermal resistance of the adhesive layer 156 may determine a thermal resistance between the upper plate 154 and the second lower plate 153. Where the second lower plate 153 and the adhesive layer 156 have the same area, the thermal resistance of the adhesive layer 156 or between the upper plate 154 and the second lower plate 153 may be increased in proportion to the thickness $T_2$ of the adhesive layer 156. The thermal resistance of the adhesive layer 156 may be calculated as a product of the thermal conductivity and the thickness 12 of the adhesive layer 156.

In the case where the thermal resistance of the capping portion 157b is different from the thermal resistance of the adhesive layer 156, the substrate W may be heated non-uniformly. For example, there may be a spatial variation in temperature of the substrate W resulting from a difference between the thermal resistance of the capping portion 157b and the thermal resistance of the adhesive layer 156.

In the case where the thermal resistance of the capping portion 157b is equal to the thermal resistance of the adhesive layer 156, the substrate W may be heated uniformly. In other words, uniformity in temperature of the substrate W may be increased. The capping portion 157b and the adhesive layer 156 may have different thermal conductivities from each other. For example, the capping portion 157b may have thermal conductivity of about 30 W/mK, and the adhesive layer 156 may have thermal conductivity of about 0.3 W/mK to about 0.4 W/mK. The capping portion 157b may have the thickness $T_4$ of about 0.6 mm and the diameter $R_2$ of about 4 mm to about 14 mm, and the adhesive layer 156 may have the thickness $T_2$ of about 0.1 mm to about 0.5 mm.

Hereinafter, a relationship between the diameter $R_2$ of the capping portion 157b having the thermal conductivity of about 30 W/mK and the thickness $T_2$ of the adhesive layer 156 having the thermal conductivity of about 0.4 W/mK will be described.

Figure 4:
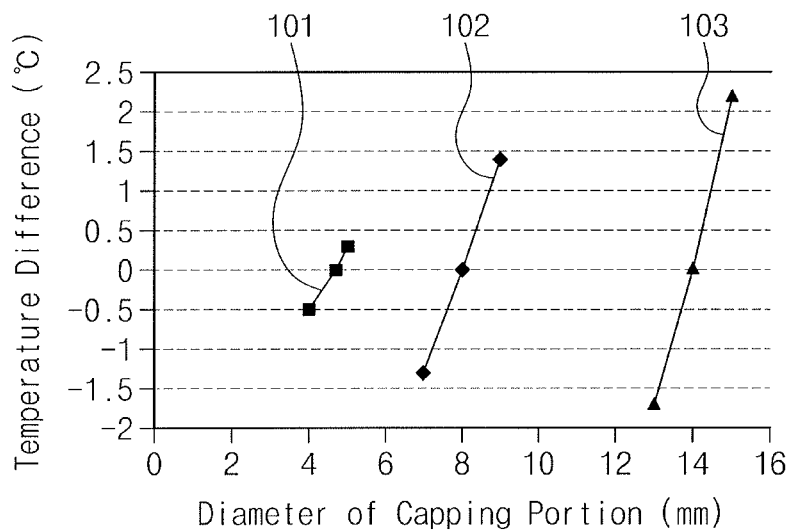
FIG. 4 is a graph showing a variation in temperature of a substrate caused by a change in diameter of a capping portion, when an adhesive layer of FIG. 3 had thermal conductivity of 0.4 W/mK.

FIG. 4 is a graph showing a variation in temperature of the substrate W on the capping portion 157b and the adhesive layer 156, when the thermal conductivity of the adhesive layer 156 of FIG. 3 was 0.4 W/mK and the diameter $R_2$ of the capping portion 157b was changed.

Referring to FIG. 4, the thermal resistance of the capping portion 157b and the thermal resistance of the adhesive layer 156 were increased in proportion to the diameter $R_2$ of the capping portion 157b. The thermal resistance of each of the capping portion 157b and the adhesive layer 156 was about 0.25 m²K/W (in line 101), 0.5 m²K/W (in line 102), or 1.0 m²K/W (in line 103).

In the case where the thermal resistance of each of the capping portion 157b and the adhesive layer 156 was 0.25 m²K/W (in line 101), a variation in temperature of the substrate W placed on the capping portion 157b having the diameter $R_2$ of about 4.7 mm and the adhesive layer 156 was decreased to about zero. That is, the uniformity in temperature of the substrate W was improved. In the case where the diameter $R_2$ of the capping portion 157b was 4 mm, the substrate W placed on the adhesive layer 156 and capping portion 157b had a temperature difference and/or variation of about −0.5° C. That is, the temperature of the substrate W was higher on the adhesive layer 156 than on the capping portion 157b by about 0.5° C. In the case where the diameter $R_2$ of the capping portion 157b was 5 mm, the substrate W placed on the adhesive layer 156 and the capping portion 157b had a temperature difference of about 0.3° C. That is, the temperature of the substrate W was lower on the adhesive layer 156 than on the capping portion 157b by about 0.3° C.

In the case where the thermal resistance of each of the capping portion 157b and the adhesive layer 156 was 0.5 m²K/W (in line 102), a variation in temperature of the substrate W placed on the capping portion 157b having the diameter $R_2$ of about 8 mm and the adhesive layer 156 was decreased to about zero. In other words, the uniformity in temperature of the substrate W was improved. In the case where the diameter $R_2$ of the capping portion 157b was 7 mm, the substrate W placed on the adhesive layer 156 and the capping portion 157b had a temperature difference of about −1.3° C. That is, the temperature of the substrate W was higher on the adhesive layer 156 than on the capping portion 157b by about 1.3° C. In the case where the diameter $R_2$ of the capping portion 157b was 9 mm, the substrate W placed on the adhesive layer 156 and the capping portion 157b had a temperature difference of about 1.4° C. That is, the temperature of the substrate W was lower on the adhesive layer 156 than on the capping portion 157b by about 1.4° C.

In the case where the thermal resistance of each of the capping portion 157b and the adhesive layer 156 was 1.0 m²K/W (in line 103), a variation in temperature of the substrate W placed on the capping portion 157b having the diameter $R_2$ of about 14 mm and the adhesive layer 156 was decreased to about zero. In the case where the diameter $R_2$ of the capping portion 157b was 13 mm, the substrate W placed on the adhesive layer 156 and the capping portion 157b had a temperature difference and/or variation of about −1.7° C. That is, the temperature of the substrate W was higher on the adhesive layer 156 than on the capping portion 157b by about 1.7° C. In the case where the diameter $R_2$ of the capping portion 157b was 15 mm, the substrate W placed on the adhesive layer 156 and the capping portion 157b had a temperature difference of about 2.2° C. That is, the temperature of the substrate W was lower on the adhesive layer 156 than on the capping portion 157b by about 2.2° C.

Figure 5:
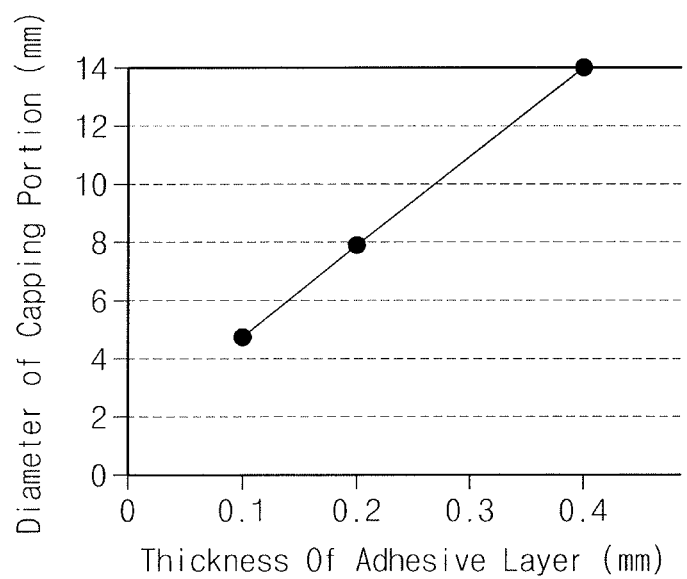
FIG. 5 is a graph showing the thickness of the adhesive layer and the diameter of the capping portion, when the variation in temperature of the substrate shown in FIG. 4 was zero.

FIG. 5 is a graph showing the thickness $T_2$ of the adhesive layer 156 and the diameter $R_2$ of the capping portion 157b, when the variation in temperature of the substrate W shown in FIG. 4 was zero.

Referring to FIG. 5, the thickness $T_2$ of the adhesive layer 156 was in proportion to the diameter $R_2$ of the capping portion 157b. In the case where the thermal conductivity of the adhesive layer 156 was about 0.4 W/mK, the diameter $R_2$ of the capping portion 157b was increased from about 30 to 40 times the thickness $T_2$ of the adhesive layer 156. When the thickness $T_2$ of the adhesive layer 156 was from about 0.1 mm to about 0.4 mm, the diameter $R_2$ of the capping portion 157b was from about 4.7 mm to about 14 mm. That is, the diameter $R_2$ of the second lower hole 193 was from about 4.7 mm to about 14 mm.

For example, when the thickness $T_2$ of the adhesive layer 156 was about 0.1 mm, the diameter $R_2$ of the capping portion 157b was about 4.7 mm. In the case where the thickness $T_2$ of the adhesive layer 156 was about 0.1 mm and the diameter $R_2$ of the capping portion 157b was about 4.7 mm, the uniformity in temperature of the substrate W was maximized. When the thickness $T_2$ of the adhesive layer 156 was about 0.2 mm, the diameter $R_2$ of the capping portion 157b was about 8 mm. When the thickness $T_2$ of the adhesive layer 156 was about 0.4 mm, the diameter $R_2$ of the capping portion 157b was about 14 mm. The uniformity in temperature of the substrate W was maximized. This result shows that the uniformity in temperature of the substrate W was maximized when the diameter $R_2$ of the capping portion 157b was increased from about 30 to 40 times the thickness $T_2$ of the adhesive layer 156 having the thermal conductivity of about 0.4 W/mK. An increase of the thickness $T_2$ of the adhesive layer 156 and the diameter $R_2$ of the capping portion 157b is from about 30 to 40.

Hereinafter, a relationship between the diameter $R_2$ of the capping portion 157b having the thermal conductivity of about 30 W/mK and the thickness $T_2$ of the adhesive layer 156 having the thermal conductivity of about 0.3 W/mK will be described.

Figure 6:
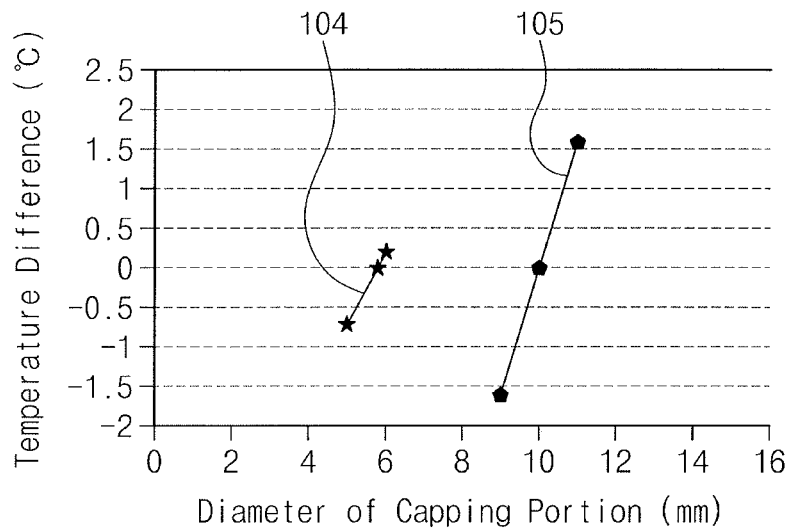
FIG. 6 is a graph showing a variation in temperature of the substrate caused by a change in diameter of the capping portion, when the adhesive layer of FIG. 3 had thermal conductivity of 0.3 W/mK.

FIG. 6 is a graph showing a variation in temperature of the substrate W on the capping portion 157b and the adhesive layer 156, when the thermal conductivity of the adhesive layer 156 of FIG. 3 was 0.3 W/mK and the diameter $R_2$ of the capping portion 157b was changed.

Referring to FIG. 6, the thermal resistance of the capping portion 157b and the thermal resistance of the adhesive layer 156 were increased in proportion to the diameter $R_2$ of the capping portion 157b. The thermal resistance of the adhesive layer 156 was, for example, about 0.333 m²K/W (in line 104) or about 0.666 m²K/W (in line 105).

In the case where the thermal resistance of the adhesive layer 156 was 0.333 m²K/W (in line 104), a variation in temperature of the substrate W placed on the capping portion 157b having the diameter $R_2$ of about 5.8 mm and the adhesive layer 156 was decreased to about zero. In other words, the uniformity in temperature of the substrate W was improved. In the case where the diameter $R_2$ of the capping portion 157b was 5 mm, the substrate W placed on the adhesive layer 156 and the capping portion 157b had a temperature difference of about −0.7° C. That is, the temperature of the substrate W was higher on the adhesive layer 156 than on the capping portion 157b by about 0.7° C. In the case where the diameter $R_2$ of the capping portion 157b was 6 mm, the substrate W placed on the adhesive layer 156 and the capping portion 157b had a temperature difference of about 0.2° C. That is, the temperature of the substrate W was lower on the adhesive layer 156 than on the capping portion 157b by about 0.2° C.

In the case where the thermal resistance of the adhesive layer 156 was 0.666 m²K/W (in line 105), a variation in temperature of the substrate W placed on the capping portion 157b having the diameter $R_2$ of about 10 mm and the adhesive layer 156 was decreased to about zero. In the case where the diameter $R_2$ of the capping portion 157b was 9 mm, the substrate W placed on the adhesive layer 156 and the capping portion 157b had a temperature difference of about −1.6° C. That is, the temperature of the substrate W was higher on the adhesive layer 156 than on the capping portion 157b by about 1.6° C. In the case where the diameter $R_2$ of the capping portion 157b was 11 mm, the substrate W placed on the adhesive layer 156 and the capping portion 157b had a temperature difference of about 1.6° C. That is, the temperature of the substrate W was lower on the adhesive layer 156 than on the capping portion 157b by about 1.6° C.

Figure 7:
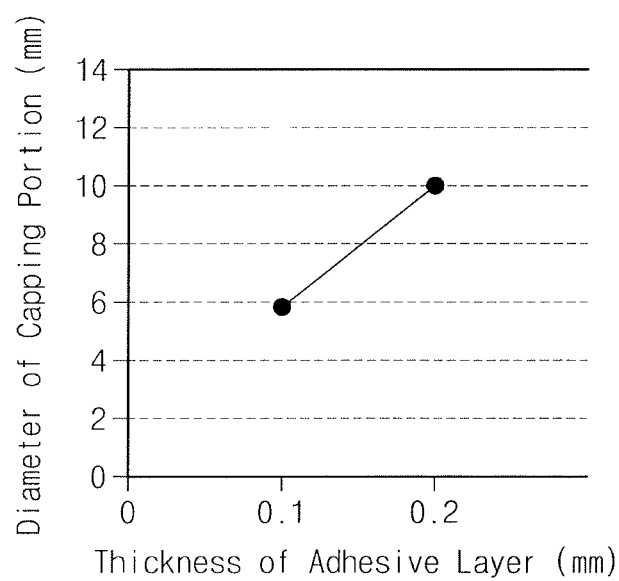
FIG. 7 is a graph showing the thickness of the adhesive layer and a diameter of the capping portion, when the variation in temperature of the substrate shown in FIG. 6 was zero.

FIG. 7 is a graph showing the thickness $T_2$ of the adhesive layer 156 and the diameter $R_2$ of the capping portion 157b, when the variation in temperature of the substrate W of FIG. 6 was zero.

Referring to FIG. 7, the thickness $T_2$ of the adhesive layer 156 was in proportion to the diameter $R_2$ of the capping portion 157b. In the case where the thermal conductivity of the adhesive layer 156 was about 0.3 W/mK, the diameter $R_2$ of the capping portion 157b was increased from about 50 to 60 times the thickness $T_2$ of the adhesive layer 156. When the thickness $T_2$ of the adhesive layer 156 was from about 0.1 mm to about 0.2 mm, the diameter $R_2$ of the capping portion 157b was from about 5.8 mm to about 10 mm. That is, the diameter $R_2$ of the second lower hole 193 was from about 5.8 mm to about 10 mm.

For example, when the thickness $T_2$ of the adhesive layer 156 was about 0.1 mm, the diameter $R_2$ of the capping portion 157b was about 5.8 mm. In the case where the thickness $T_2$ of the adhesive layer 156 was about 0.1 mm and the diameter $R_2$ of the capping portion 157b was about 5.8 mm, the uniformity in temperature of the substrate W was improved. When the thickness $T_2$ of the adhesive layer 156 was about 0.2 mm, the diameter $R_2$ of the capping portion 157b was about 10 mm. That is, the uniformity in temperature of the substrate W was improved. This result shows that the uniformity in temperature of the substrate W was maximized when the diameter $R_2$ of the capping portion 157b was increased from about 50 to 60 times the thickness $T_2$ of the adhesive layer 156 with the thermal conductivity of about 0.3 W/mK, within a range of about 5.8 mm to about 10 mm.

Figure 8:
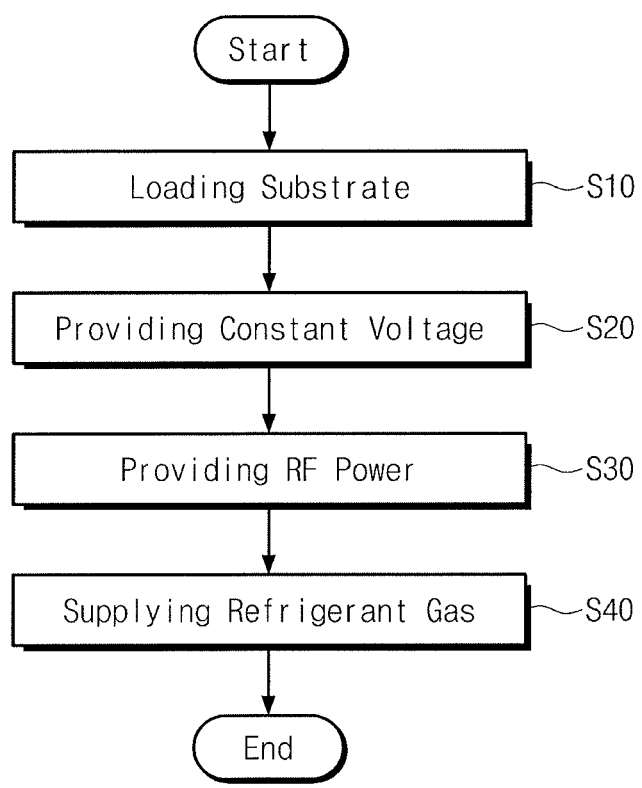
FIG. 8 is a flow chart of stages in a method of fabricating a semiconductor device, using the plasma processing apparatus of FIG. 1.

FIG. 8 is a flow chart illustrating a method of fabricating a semiconductor device, using the plasma processing apparatus 100 of FIG. 1.

Referring to FIG. 8, a method of fabricating a semiconductor device may include loading a substrate W (in S10), providing the DC power 162 (in S20), providing a radio or high frequency power (in S30), and supplying the refrigerant gas 172 (in S40).

When the lower housing 112 and the upper housing 114 are separated from each other, the substrate W may be loaded on the electrostatic chuck 150 using a robot arm (in S10).

Next, the lower housing 112 and the upper housing 114 may be combined to each other, and then, the DC power supply part 160 may apply the DC power 162 to the electrostatic chuck 150 (in S20).

Thereafter, the RF supply part 140 may supply a radio or high frequency power to the upper electrode 132 and/or the electrostatic chuck 150 (in S30). The first RF supply part 142 may supply the source power 143 to the upper electrode 132, and the second RF supply part 144 may supply the bias power 145 to the electrostatic chuck 150. The source power 143 and the bias power 145 may be generated to have a frequency of several Hertz to several tens of Hertz. The source power 143 may be used to produce the plasma 12 on the substrate W. In addition, the gas supplying part 120 may supply the reaction gas 122 to the showerhead 130. The bias power 145 may be used to concentrate the plasma 12 and the reaction gas 122 on the substrate W. The substrate W may be etched by the plasma 12 and/or the reaction gas 122. The electrostatic chuck 150 may be configured to improve the uniformity in temperature of the substrate W, and this may make it possible to improve etching characteristics in an etching process using the plasma 12. For example, it may be possible to improve etching uniformity of the substrate W. In an example embodiment, the reaction gas 122 may be used to deposit a thin film on the substrate W. Because of the afore-described structure of the electrostatic chuck 150, it may be possible to improve deposition uniformity of the thin film. In an example embodiment, the plasma 12 may be used to heat the substrate W to a high temperature, and in this case, it may be possible to increase etch selectivity between thin films provided on the substrate W. For example, in the case where the substrate W is heated to a temperature of about 100° C. or higher, an etch selectivity of a silicon oxide layer with respect to a metal thin film on the substrate W may be increased.

Thereafter, the refrigerant supply part 170 may supply the refrigerant gas 172 in the electrostatic chuck 150 (in S40). The electrostatic chuck 150 may be configured to provide the refrigerant gas 172 onto the bottom surface of the substrate W. The refrigerant gas 172 may be provided to the bottom surface of the substrate W through the lower hole 192, the porous block 159, and the upper hole 194 of the electrostatic chuck 150.

Next, when the step of processing the substrate W is finished, the lower housing 112 may be separated from the upper housing 114. The substrate W may be unloaded from the electrostatic chuck 150 using the robot arm.

As described above, embodiments relate to a semiconductor fabricating system, and in particular, to an electrostatic chuck configured to load a substrate and a plasma processing apparatus including the same.

Embodiments may provide an electrostatic chuck configured to improve temperature uniformity of a substrate provided thereon, and a plasma processing apparatus including the same.

According to an example embodiment, an electrostatic chuck may be configured to have a refrigerant gas hole, whose diameter is in proportion to a thickness of an adhesive layer, and a bushing in the refrigerant gas hole. It may be possible to reduce a spatial variation in temperature of a substrate (for example a temperature difference between two portions of the substrate placed on the refrigerant gas hole and on the adhesive layer).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electrostatic chuck, comprising:
a chuck base having a cooling water hole, the chuck base including;
  a first lower plate disposed under the cooling water hole, the first lower plate having a first hole; and
  a second lower plate having a second hole larger than the first hole,
an upper plate provided on the chuck base, the upper plate having an upper surface extending in a horizontal direction and configured to receive a wafer thereon, the upper plate having a third hole aligned with the first hole and the second hole;
an adhesive layer extending in the horizontal direction and directly contacting a lower surface of the upper plate and an upper surface of the second lower plate and attaching the upper plate to the second lower plate, the adhesive layer having a thickness in a vertical direction that is less than a diameter in the horizontal direction of the second hole and equal to a diameter of the third hole;
a bushing in the second hole;
a porous block in the bushing, the porous block being configured to pass a gas from the second hole to the third hole; and
a gas supplying line providing the gas in the bushing, wherein the bushing includes:
  an upper bushing surrounding the porous block; and
  a lower bushing disposed in the upper bushing and disposed between the first lower plate and the porous block,
wherein the upper bushing includes:
  a ring portion having an outer diameter equal to the diameter of the second hole, and surrounding the porous block and the lower bushing, and
  a capping portion disposed on the porous block and connected to the ring portion, the capping portion having an outer diameter equal to the diameter of the second hole,
wherein the adhesive layer contacts a sidewall of the capping portion, and
wherein the gas supplying line is provided in the first hole and connected to the lower bushing.

2. The electrostatic chuck as claimed in claim 1, wherein:
the capping portion is provided on the ring portion to be in contact with the upper plate, and has a third bushing hole,
the capping portion directly contacts the ring portion, an entirety of the capping portion from an outermost edge of the third bushing hole to the ring portion having a constant thickness along the vertical direction,
the third bushing hole has a same diameter as the third hole,
the ring portion and the capping portion have equal thicknesses and are in the form of a single object, and
the thicknesses of the ring portion and the capping portion are greater than the thickness in the vertical direction of the adhesive layer.

3. The electrostatic chuck as claimed in claim 2, wherein:
the adhesive layer has a thickness ranging from about 0.1 mm to about 0.4 mm, and
the first hole has a diameter ranging from about 4.7 mm to about 14 mm.

4. The electrostatic chuck as claimed in claim 2, wherein:
the capping portion has a thickness of 0.6 mm at the outermost edge of the third bushing hole and a thermal conductivity of about 30 W/mK, and
the adhesive layer has a thermal conductivity of about 0.3 W/mK to about 0.4 W/mK.

5. The electrostatic chuck as claimed in claim 4, wherein:
the adhesive layer has a thermal conductivity of about 0.4 W/mK, and
the diameter of the first hole is from about 30 to 40 times the thickness of the adhesive layer.

6. The electrostatic chuck as claimed in claim 4, wherein:
the thickness of the adhesive layer is about 0.1 mm, and
the diameter of the first hole is about 4.7 mm.

7. The electrostatic chuck as claimed in claim 4, wherein:
the thickness of the adhesive layer is about 0.2 mm, and
the diameter of the first hole is about 8 mm.

8. The electrostatic chuck as claimed in claim 4, wherein:
the thickness of the adhesive layer is about 0.4 mm, and
the diameter of the first hole is about 14 mm.

9. The electrostatic chuck as claimed in claim 4, wherein:
the adhesive layer has a thermal conductivity of about 0.3 W/mK, and
the diameter of the first hole is from about 50 to 60 times the thickness of the adhesive layer.

10. The electrostatic chuck as claimed in claim 4, wherein:
the thickness of the adhesive layer ranges from about 0.1 mm to about 0.2 mm, and
the diameter of the first hole ranges from about 5.8 mm to about 10 mm.

11. A plasma processing apparatus, comprising:
a chamber;
the electrostatic chuck as claimed in claim 1 provided in the chamber; and a refrigerant supply part configured to supply a refrigerant gas into the first, third, and second holes, in sequence, in the electrostatic chuck.

12. A method of fabricating a semiconductor device, the method comprising:
    providing a substrate on the electrostatic chuck as claimed in claim 1;
    supplying a refrigerant gas into the first, third, and second holes, in sequence, in the electrostatic chuck;
    providing a DC power to the electrostatic chuck; and
    providing a high or radio frequency power to the electrostatic chuck to produce plasma on the electrostatic chuck.

13. An electrostatic chuck, comprising:
    a chuck base having a cooling water hole, the chuck base including:
        a first lower plate disposed under the cooling water hole, the first lower plate having a first hole; and
        a second lower plate having a second hole larger than the first hole,
    an upper plate provided on the chuck base, the upper plate having an upper surface extending in a horizontal direction and configured to receive a wafer thereon, the upper plate having a third hole aligned with the first hole and the second hole;
    an adhesive layer extending in the horizontal direction and directly contacting a lower surface of the upper plate and an upper surface of the second lower plate and attaching the upper plate to the second lower plate, the adhesive layer having a thickness in a vertical direction that is less than a diameter in the horizontal direction of the second hole and equal to a diameter of the third hole;
    a bushing in the second hole;
    a porous block in the bushing, the porous block being configured to pass a gas from the second hole to the third hole; and
    a gas supplying line providing the gas in the bushing,
    wherein the bushing includes:
        an upper bushing surrounding the porous block; and
        a lower bushing disposed in the upper bushing and disposed between the first lower plate and the porous block,
        wherein the upper bushing includes:
            a ring portion having an outer diameter equal to the diameter of the second hole, and surrounding the porous block and the lower bushing, and
            a capping portion disposed on the porous block and connected to the ring portion, the capping portion having an outer diameter equal to the diameter of the second hole,
            wherein the ring portion and the capping portion have equal thicknesses and are in the form of a single object, and
            wherein the adhesive layer contacts a sidewall of the capping portion, and
    wherein the gas supplying line is provided in the first hole and connected to the lower bushing.

14. The electrostatic chuck as claimed in claim 13, wherein the capping portion is penetrated by a third bushing hole aligned with and having a same diameter as the third hole.

15. The electrostatic chuck as claimed in claim 14, wherein the thickness of the capping portion where the third bushing hole penetrates the capping portion is greater than the thickness in the vertical direction of the adhesive layer.

16. The electrostatic chuck as claimed in claim 13, wherein the thicknesses of the ring portion and the capping portion are greater than the thickness in the vertical direction of the adhesive layer.

* * * * *